(12) United States Patent
Lou (10) Patent No.: US 11,879,913 B2
(45) Date of Patent: Jan. 23, 2024

(54) PROBE CARD STRUCTURE (71) Applicant: teCat Technologies (Suzhou) Limited, Suzhou (CN)

(72) Inventor: Choon Leong Lou, Suzhou (CN)

(73) Assignee: XINZHUO TECHNOLOGY (ZHEJIANG) CO., LTD., Zhejiang (CN)

( * ) Notice: Subject to any disclaimer, the term of this patent is extended or adjusted under 35 U.S.C. 154(b) by 0 days.

(21) Appl. No.: 17/673,907

(22) Filed: Feb. 17, 2022

(65) Prior Publication Data

US 2023/0025864 A1 Jan. 26, 2023

(30) Foreign Application Priority Data

Jul. 26, 2021 (CN) .......................... 202110844671.6

(51) Int. Cl.
G01R 1/073 (2006.01)
(52) U.S. Cl.
CPC ..... G01R 1/07314 (2013.01); G01R 1/07378 (2013.01)
(58) Field of Classification Search
CPC ... G01R 1/07314; G01R 1/07378; G01R 3/00
See application file for complete search history.

(56) References Cited

U.S. PATENT DOCUMENTS

| 2014/0210505 A1* | 7/2014 | Chen | G01R 1/0735 |
| | | | 324/756.03 |
| 2014/0306730 A1* | 10/2014 | Chen | G01R 1/07378 |
| | | | 324/750.16 |
| 2018/0024167 A1* | 1/2018 | Maggioni | G01R 31/2889 |
| | | | 324/750.24 |
| 2020/0057095 A1* | 2/2020 | Liberini | G01R 1/07342 |

FOREIGN PATENT DOCUMENTS

| CN | 102012470 A | 4/2011 |
| CN | 112002685 A | 11/2020 |
| JP | 2007171140 A | 7/2007 |

(Continued)

OTHER PUBLICATIONS

Taiwan Patent Office, Office action dated Nov. 16, 2022.
Japan Patent Office, Office action dated Nov. 24, 2022.
Taiwan Patent Office, Office action dated Jul. 28, 2022.

*Primary Examiner* — Son T Le
*Assistant Examiner* — Adam S Clarke
(74) *Attorney, Agent, or Firm* — Li & Cai Intellectual Property (USA) Office (57) ABSTRACT A probe card structure is provided. The probe card structure includes a circuit board, an adapter board, and a probe head assembly. The adapter board is disposed on one side of the circuit board, a plurality of electrically conductive pillars are formed on one surface of the adapter board that faces the circuit board. A solder ball is disposed on one end of each of the plurality of electrically conductive pillars facing the circuit board, and the adapter board is coupled to the circuit board through the solder balls of the plurality of electrically conductive pillars. The probe head assembly including a plurality of probes, the probe head assembly is coupled to the adapter board, and the plurality of probes are electrically connected to the adapter board.

8 Claims, 6 Drawing Sheets (56) References Cited

FOREIGN PATENT DOCUMENTS

| | | |
|---|---|---|
| JP | 2012008071 A | 1/2012 |
| JP | 2016008948 A | 1/2016 |
| TW | M457182 U | 7/2013 |
| TW | 201636623 A | 10/2016 |
| TW | 201810484 A | 3/2018 |
| TW | 201839409 A | 11/2018 |

* cited by examiner

PROBE CARD STRUCTURE

CROSS-REFERENCE TO RELATED PATENT APPLICATION

This application claims the benefit of priority to China Patent Application No. 202110844671.6 filed on Jul. 26, 2021 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a probe card structure, and more particularly to a probe card structure that uses electrically conductive pillars and solder balls to bond an adapter board and a circuit board.

BACKGROUND OF THE DISCLOSURE

Firstly, probe card devices generally include an adapter board and a main circuit board. The adapter board is a space transformer, and can be a circuit substrate with a multilayer structure in practice. In the conventional technology, a solder ball reflow technique is usually used for the bonding between circuit substrates inside the adapter board or the bonding between the adapter board and the main circuit board.

However, the solder ball reflow technique still has flaws that need to be addressed. For example, a size of each of the solder balls is difficult to be consistent in the current manufacturing process technology, or the solder ball is deformed due to a difference between pressing forces and a difference between reflow temperatures. Therefore, the circuit substrate is prone to tilt or even deform due to the difference in the size of the solder balls during a bonding process, which causes a plurality of contact points of an interposer board and the probes to be uneven in height, and further affects the position and flatness of a plurality of probes.

In addition to the solder ball reflow technique, a Cu core ball is also used in the conventional technology as a joining element between the circuit substrates inside the adapter board or between the adapter board and the main circuit board. The Cu core ball is a type of solder ball, and is formed by plating a layer of tin on a surface of a copper core. Since the copper core has a fixed size, the issue of the solder ball reflow technology being prone to cause unevenness in height among the plurality of contact points can be improved. However, a disadvantage of the copper core ball is that the amount of tin is insufficient, so that the bonding strength becomes insufficient.

Therefore, it has become one of important issues in this field to overcome the aforementioned inadequacies through an improvement in structural design.

SUMMARY OF THE DISCLOSURE

In response to the above-referenced technical inadequacies, the present disclosure provides a probe card structure.

In one aspect, the present disclosure provides a probe card structure. The probe card structure includes a circuit board, an adapter board, and a probe head assembly. The adapter board is disposed on one side of the circuit board, a plurality of electrically conductive pillars are formed on one surface of the adapter board that faces the circuit board, a solder ball is disposed on one end of each of the plurality of electrically conductive pillars facing the circuit board, and the adapter board is coupled to the circuit board through the solder balls of the plurality of electrically conductive pillars. The probe head assembly includes a plurality of probes, the probe head assembly is coupled to the adapter board, and the plurality of probes are electrically connected to the adapter board.

In certain embodiments, the probe card structure further includes a fixing frame member detachably fixed on one side of the circuit board, and the fixing frame member is used to fix the adapter board and the probe head assembly on a same side of the circuit board.

In certain embodiments, the probe card structure further includes a structure strengthening member, and the structure strengthening member and the adapter board are respectively arranged on opposite sides of the circuit board.

In certain embodiments, the probe card structure further includes a plurality of locking members. The fixing frame member includes a plurality of first through holes, the circuit board includes a plurality of second through holes corresponding to the plurality of first through holes, and the structural reinforcement member includes a plurality of threaded holes corresponding to the plurality of second through holes. The plurality of locking members respectively pass through the plurality of first through holes and the plurality of second through holes to be inserted in the plurality of threaded holes, so as to fix the fixing frame member.

In certain embodiments, a material of the plurality of electrically conductive pillars is copper or a copper alloy.

In certain embodiments, a diameter of the plurality of electrically conductive pillars is less than 200 μm.

In certain embodiments, the adapter board is an interposer board, and the plurality of electrically conductive pillars are formed on one surface of the interposer board facing the circuit board. Each of the solder balls is disposed on the one end of each of the plurality of electrically conductive pillars facing the circuit board, and the interposer board is soldered to the circuit board through the plurality of solder balls.

In certain embodiments, the probe card structure further includes an interposer board disposed between the adapter board and the circuit board. A plurality of second electrically conductive pillars are formed on one surface of the interposer board facing the circuit board, a second solder ball is disposed on the one end of each of the plurality of second electrically conductive pillars facing the circuit board, and the interposer board is soldered to the circuit board through the plurality of second solder balls. The adapter board is soldered to the interposer board through the plurality of solder balls.

In certain embodiments, one end of each of the plurality of probes is electrically connected to the adapter board, another end of each of the plurality of probes is in contact with a device under test, and the adapter board and the device under test have same material characteristics.

In certain embodiments, the material characteristics include hardness, ductility, electrical conductivity, or thermal expansion coefficient.

Therefore, in the probe card structure provided by the present disclosure, by virtue of "a plurality of electrically conductive pillars are formed on one surface of the adapter board that faces the circuit board, a solder ball is disposed on one end of each of the plurality of electrically conductive pillars facing the circuit board, and the adapter board is coupled to the circuit board through the solder balls of the plurality of electrically conductive pillars," a flatness during bonding of the adapter board and the circuit board is improved, and a bonding strength between the adapter board and the circuit board is upheld at the same time.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Embodiment

Figure 1:
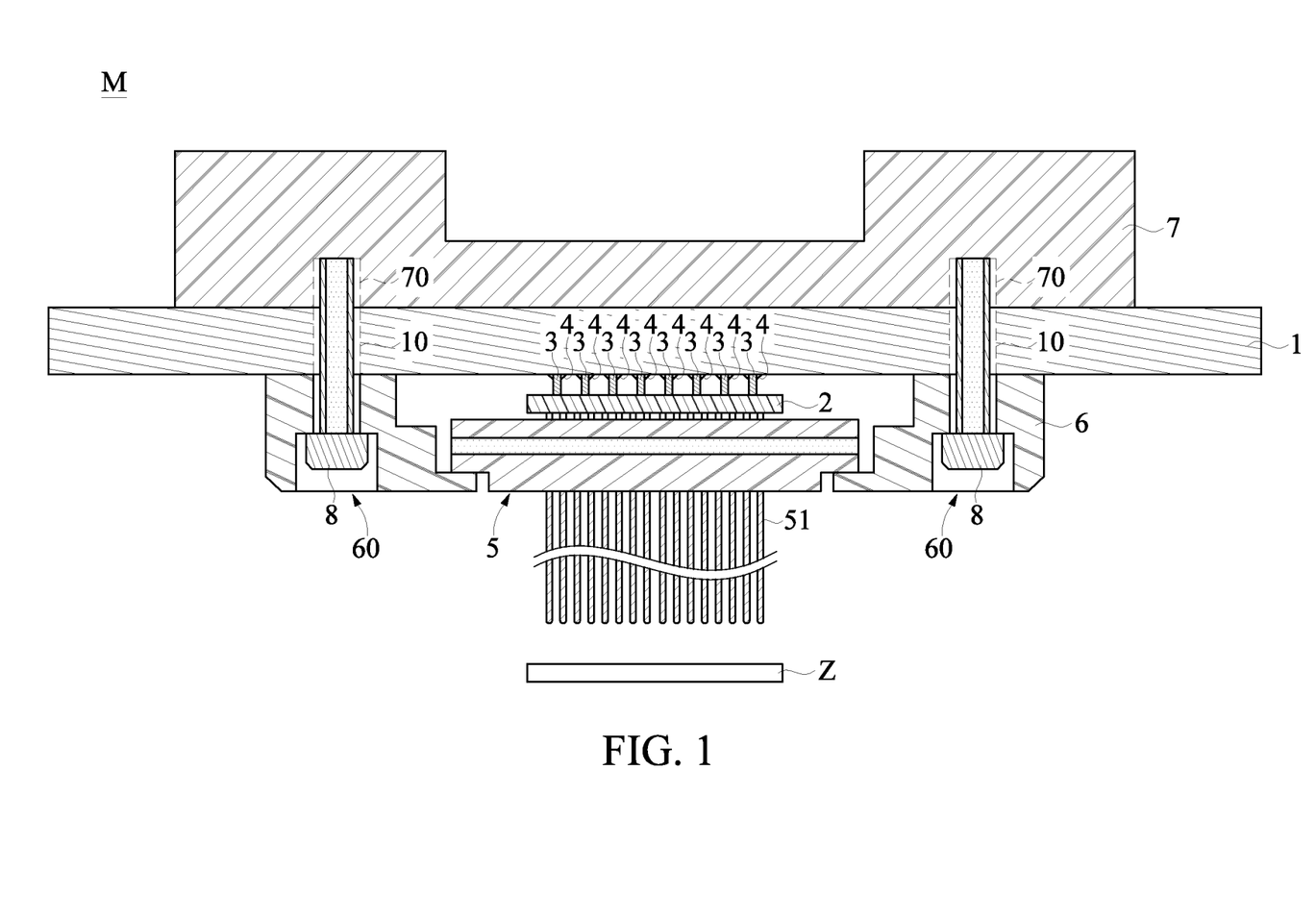
FIG. 1 is a cross-sectional view of a probe card structure according to the present disclosure.

Reference is made to FIG. 1, which is a cross-sectional view of a probe card structure according to the present disclosure. The present disclosure provides a probe card structure M, which includes a circuit board 1, an adapter board 2, and a probe head assembly 5. For example, the circuit board 1 may be a printed circuit board (PCB) or a flexible printed circuit board (FPCB), and the adapter board 2 may be a multilayer organic (MLO) substrate or a multilayer ceramic (MLC) substrate, but it is not limited thereto. In this embodiment, the adapter board 2 is disposed on one side of the circuit board 1, a plurality of electrically conductive pillars 3 are formed on one surface of the adapter board 2 that faces the circuit board 1, a solder ball 4 (or a solder bump) is disposed on one end of each of the plurality of electrically conductive pillars 3 facing the circuit board 1, and the adapter board 2 is coupled to the circuit board 1 through the solder balls 4 of the plurality of electrically conductive pillars 3. Furthermore, the electrically conductive pillars 3 can be formed by manners such as electroplating, sputtering, evaporation, ion plating or the like, and solder balls can be formed by manners such as electroplating, sputtering, solder ball plating, or the like. The material of the electrically conductive pillars 3 is metal, and preferably is copper (i.e., copper pillars) or a copper alloy, and the material of the solder balls is tin, a tin alloy, gold, or a gold alloy, but the present disclosure is not limited thereto. Each of the electrically conductive pillars 3 is bonded to the circuit board 1 by molten tin formed by the solder ball 4, so that the adapter board 2 is soldered to the circuit board 1. The probe head assembly 5 is coupled to the adapter board 2, in other words, the adapter board 2 is disposed between the probe head assembly 5 and the circuit board 1.

Accordingly, the probe head assembly 5 includes a plurality of probes 51, when the probe head assembly 5 is coupled to the adapter board 2, one end of each of the plurality of probes 51 is electrically connected to the adapter board 2, and another end of each of the plurality of probes 51 is in contact with a device under test (DUT) Z, so as to perform test on the DUT Z. For example, the plurality of probes 51 may be cantilever probes or cobra probes, and the present disclosure is not limited to types of the probes 51.

Figure 2:
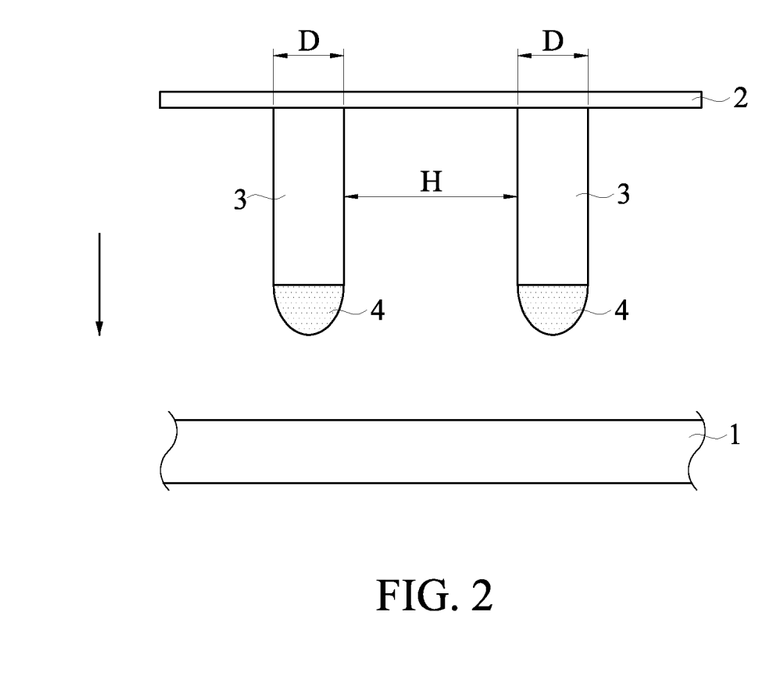
FIG. 2 is a schematic view of an adapter board and a circuit board before bonding according to the present disclosure.
Figure 3:
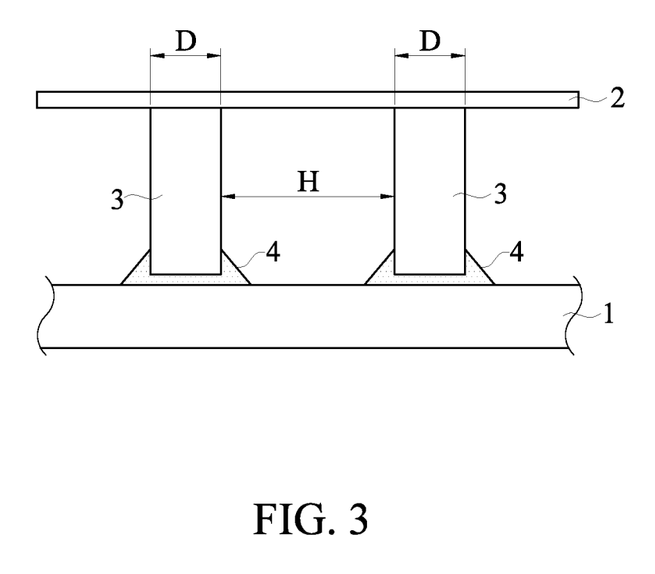
FIG. 3 is a schematic view of the adapter board and the circuit board during bonding according to the present disclosure.
Figure 4:
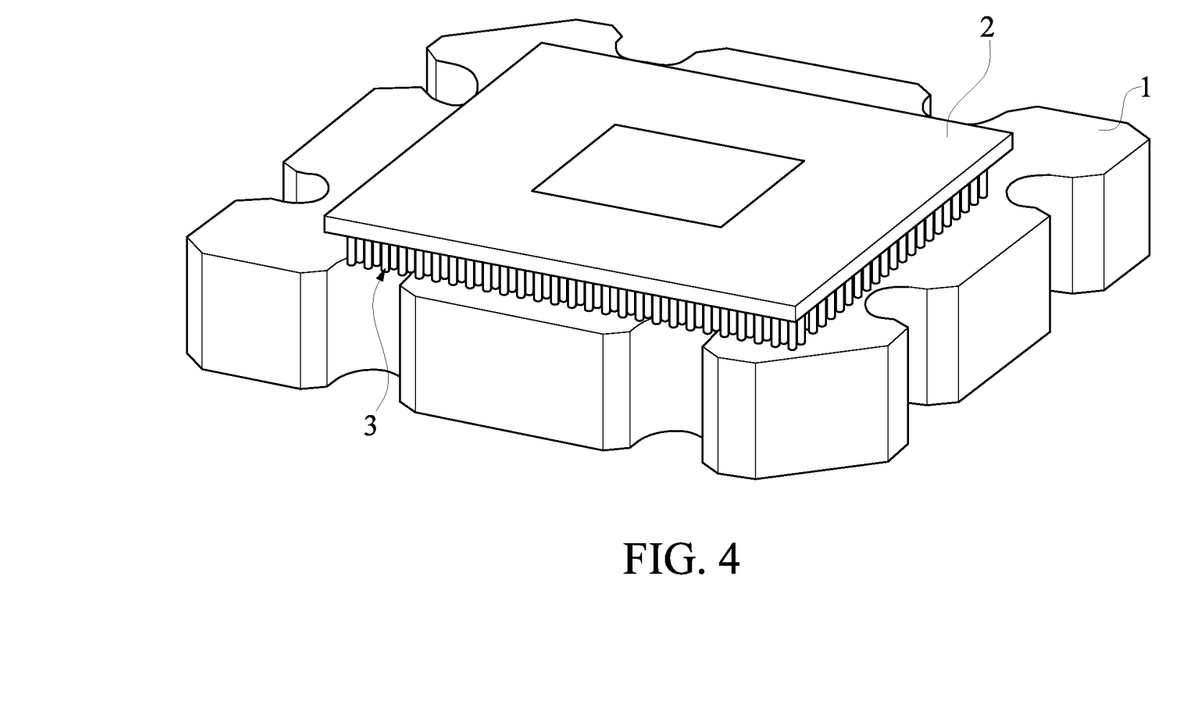
FIG. 4 is a schematic perspective view of the adapter board and the circuit board during bonding according to the present disclosure.
Figure 5:
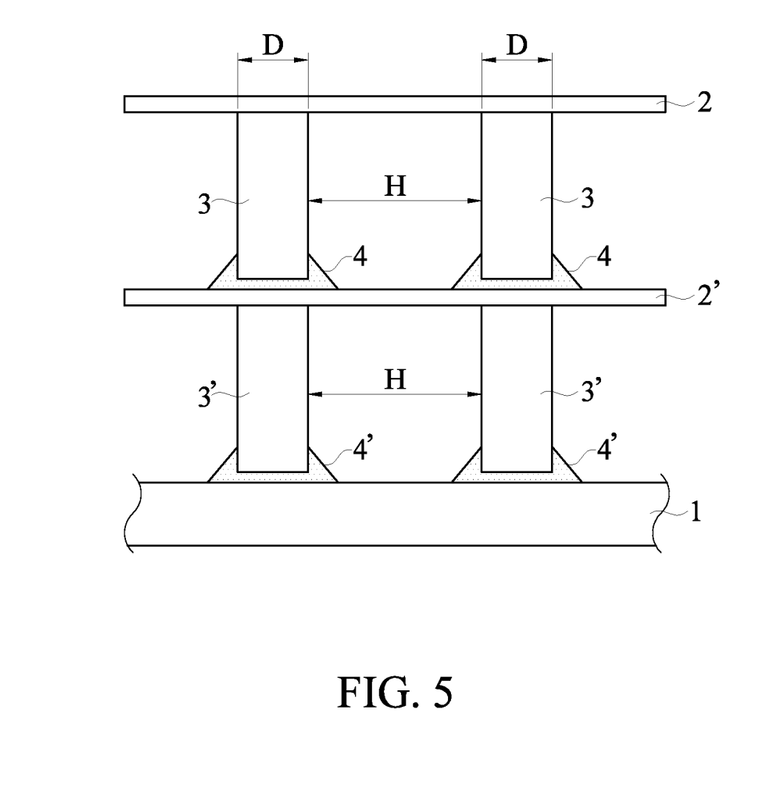
FIG. 5 is a schematic view of the adapter board, an interposer board and the circuit board before bonding according to the present disclosure.

It should be noted that, the aforementioned implementation of the adapter board 2 being coupled to the circuit board 1 through the solder balls 4 of the plurality of electrically conductive pillars 3 may be different according to different probe card structures. For example, the adapter board 2 is directly coupled to the circuit board 1 through the solder balls 4 of the plurality of electrically conductive pillars 3, as shown in FIG. 2 and FIG. 3, or the adapter board 2 is indirectly coupled to the circuit board 1 through the solder balls 4 of the plurality of electrically conductive pillars 3, as shown in FIG. 4 and FIG. 5. Specific structures of the two implementations are further described as follows.

Reference is made to FIG. 2 and FIG. 3, FIG. 2 is a schematic view of an adapter board and a circuit board before bonding according to the present disclosure, and FIG. 3 is a schematic view of the adapter board and the circuit board during bonding according to the present disclosure. The plurality of electrically conductive pillars 3 are formed on one surface of the adapter board 2 (as shown in FIG. 2), and a solder ball 4 is disposed on an end of each of the plurality of electrically conductive pillars 3. In other words, one end of each of the plurality of electrically conductive pillars 3 is connected to the adapter board 2, and another end of each of the plurality of electrically conductive pillars 3 has a solder ball 4 disposed thereon. When the adapter board 2 and the circuit board 1 are bonded, the another end of each of the plurality of electrically conductive pillars 3 having the solder ball 4 faces the circuit board 1 (in a direction as represented in an arrow shown in FIG. 2), allowing the solder ball 4 to contact the circuit board 1 (as shown in FIG. 3). That is, the adapter board 2 is directly coupled to the circuit board 1 through the solder balls 4 of the plurality of electrically conductive pillars 3, and each of the solder balls 4 is connected between each of the electrically conductive pillars 3 and the circuit board 1. Then, under a high temperature manufacturing process, the solder balls 4 are molten (that is, form molten solder) to solder each of the electrically conductive pillars 3 on the circuit board 1 (that is, soldering the adapter board 2 on the circuit board 1), thereby fixing the adapter board 2 on the circuit board 1. Furthermore, the adapter board 2 is also connected to the circuit board 1 by the electrically conductive pillars 3 and the solder balls 4.

Accordingly, reference is further made to FIG. 2 and FIG. 3, according to different probe card structures, the adapter board 2 may also be an interposer board, the plurality of electrically conductive pillars 3 are formed on one surface of the interposer board facing the circuit board 1, one end of each of the plurality of electrically conductive pillars 3 is connected to the interposer board, and another end of each of the plurality of electrically conductive pillars 3 has a solder ball 4 disposed thereon. When the interposer board and the circuit board 1 are bonded, the another end of each of the plurality of electrically conductive pillars 3 having the solder ball 4 faces the circuit board 1, allowing the solder ball 4 to contact the circuit board 1.

Figure 6:
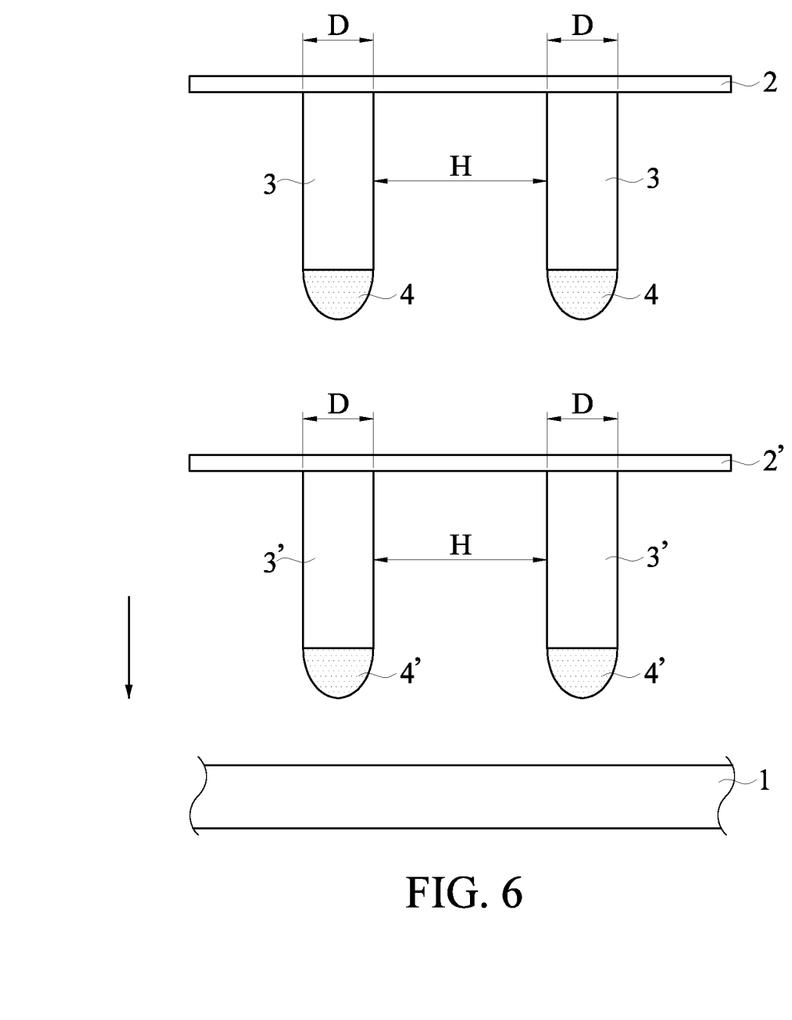
FIG. 6 is a schematic view of the adapter board, the interposer board and the circuit board during bonding according to the present disclosure.

Furthermore, reference is firstly made to FIG. 5 and FIG. 6, according to different probe card structures, an interposer board 2' is further disposed between the adapter board 2 and the circuit board 1, a plurality of second electrically conductive pillars 3' are formed on one surface of the interposer board 2' facing the circuit board 1, one end of each of the plurality of second electrically conductive pillars 3' is connected to the interposer board 2', and another end of each of the plurality of second electrically conductive pillars 3' facing the circuit board 1 has a second solder ball 4' disposed thereon. When the interposer board 2' and the circuit board 1 are bonded, the second solder balls 4' are in contact with the circuit board 1. Moreover, the plurality of electrically conductive pillars 3 formed on one surface of the adapter board 2 faces the interposer board 2'. Therefore, one end of each of the plurality of electrically conductive pillars 3 is connected to the adapter board 2, and another end of each of the plurality of electrically conductive pillars 3 facing the interposer board 2' has a solder ball 4 disposed thereon. When the adapter board 2 and the interposer board 2' are bonded, the solder balls 4 are in contact with the interposer board 2' such that each of the electrically conductive pillars 3 is soldered to the interposer board 2'. That is, the adapter board 2 is indirectly coupled to the circuit board 1 (the interposer board 2' is coupled therebetween) through the solder balls 4 of the plurality of electrically conductive pillars 3. Therefore, the adapter board 2, the interposer board 2', and the circuit board are bonded into an assembly through a soldering process.

According to the above, it is worth mentioning that, a preferred implementation in the present disclosure is that a diameter D of each of the plurality of electrically conductive pillars 3 and each of the plurality of second electrically conductive pillars 3' is less than 200 µm. Furthermore, a gap H is defined between two adjacent ones of the plurality of electrically conductive pillars 3 and two adjacent ones of the plurality of second electrically conductive pillars 3', and the gap H is preferably at least greater than 20 µm.

Furthermore, reference is made to FIG. 4, which is a schematic perspective view of the adapter board and the circuit board during bonding according to the present disclosure. It is worth noting that, the arrangement of the adopter board 2 being above the circuit board 1 as shown in FIG. 2 to FIG. 4 is only shown for the sake of convenience in exemplifying and description. In a practical probe card structure M, the adapter board 2 is below the circuit board 1 (as shown in FIG. 1). Reference can be further made to FIG. 2, FIG. 3 and FIG. 4, in the present disclosure, only one end of each of the electrically conductive pillar 3 is required to have a solder ball 4 disposed thereon, and a size of each of the electrically conductive pillars 3 is fixed. Comparing to the conventional technology, which uses solder balls or Cu core balls for bonding, the present disclosure utilizing the electrically conductive pillars 3 in conjunction with the solder balls 4 can effectively maintain a flatness of the adapter board 2 when the adaptor board 2 is bonded with the circuit board 1 (since the size of each of the electrically conductive pillars 3 is fixed), and an amount of solder can also be effectively controlled (in the conventional technology, an amount of solder of the solder ball is too high, and an amount of solder of the Cu core ball is too low). In addition, the diameter D of each of the electrically conductive pillars 3 and the gap H between two adjacent ones of the electrically conductive pillars 3 in the present disclosure are very small, such that the electrically conductive pillars 3 that may be configured on a junction between the adapter board 2 and the circuit board 1 are arranged in a large quantity and densely disposed. As a result, a signal transmission speed between the adapter board 2 and the circuit board 1 can be greatly accelerated.

Reference is further made to FIG. 1, the probe card structure M further includes a fixing frame member 6 detachably fixed on the one side of the circuit board 1, and the fixing frame member 6 is used to fix the adapter board 2 and the probe head assembly 5 that is coupled to the adapter board 2 on a same side of the circuit board 1. Specifically, the fixing frame member 6 can be a ring-shaped frame that essentially abuts against a periphery of the probe head assembly 5. Therefore, when the probe head assembly 5 is fixed on the circuit board 1 by the fixing frame member 6, the plurality of probes 51 located at a central portion of the probe head assembly 5 can be unrestricted by the fixing frame member 6 and extend downward to contact the DUT Z and perform test.

Reference is further made to FIG. 1, the probe card structure M further includes a structure strengthening member 7, and the structure strengthening member 7 is disposed on another side of the circuit board 1, so that the structure strengthening member 7 and the adapter board 2 are respectively arranged on opposite sides of the circuit board 1. According to the above, the circuit board 1 may be a printed circuit board (PCB) or a flexible printed circuit board (FPCB). In other words, a structural strength of the circuit board 1 may be limited due to material characteristics of the circuit board 1. Therefore, by disposing the structure strengthening member 7, the structural strength of the circuit board 1 can be reinforced. However, the present disclosure is not limited to a shape of the structure strengthening member 7 and a manner of connection between the structure strengthening member 7 and the circuit board 1.

Reference is further made to FIG. 1, in which the probe card structure M further includes a plurality of locking members 8. The fixing frame member 6 includes a plurality of first through holes 60, the circuit board 1 includes a plurality of second through holes 10 corresponding to the plurality of first through holes 60, and the structural reinforcement member 7 includes a plurality of threaded holes 70 corresponding to the plurality of second through holes 10. When the fixing frame member 6 is used to fix the adapter board 2 and the probe head assembly 5 that is coupled to the adapter board 2 on the same side of the circuit board 1, the plurality of locking members 8 respectively pass through the plurality of first through holes 60 and the plurality of second through holes 10 to be inserted in the plurality of threaded holes 70, so as to fix the fixing frame member 6.

Reference is further made to FIG. 3 and FIG. 5, it should be noted that, in the present disclosure, the adapter board 2 and/or the interposer board 2' and the DUT Z may have same material characteristics. For example, the material of the adapter board 2 and/or the interposer board 2' includes silicon nitride, aluminum nitride, silicon carbide, zinc oxide, gallium nitride, or gallium arsenide. The material characteristics include, but are not limited to, hardness, ductility, electrical conductivity, or thermal expansion coefficient. However, the present disclosure is not limited to the above-mentioned example.

For example, if the DUT Z is a wafer under test and a material thereof is a silicon nitride substrate material, then the material of the adapter board 2 and/or the interposer board 2' may be the same silicon nitride substrate material as that of the wafer under test. Since the probes 51 of the probe head assembly 5 are directly implanted on the adapter board 2 that has the same material characteristics as the wafer under test, the wafer under test has the same thermal expansion and contraction effect as the adapter board 2 and the interposer board 2'. Therefore, an amount of offset caused by thermal expansion and contraction on a position under test of a surface of the wafer under test is the same as an amount of offset caused by thermal expansion and contraction on a probing position of the probes 51, thereby enhancing an accuracy of probing of the probes 51. However, the present disclosure is not limited to the abovementioned example.

Beneficial Effects of the Embodiment

In conclusion, in the probe card structure provided by the present disclosure, by virtue of "a plurality of electrically conductive pillars 3 are formed on one surface of the adapter board 2 that faces the circuit board 1, a solder ball 4 is disposed on one end of each of the plurality of electrically conductive pillars 3 facing the circuit board 1, and the adapter board 2 is coupled to the circuit board 1 through the solder balls 4 of the plurality of electrically conductive pillars 3," a flatness during bonding of the adapter board 2 and the circuit board 1 is improved, and a bonding strength between the adapter board 2 and the circuit board 1 is upheld at the same time.

Furthermore, in the present disclosure, only one end of the electrically conductive pillar 3 needs to have a solder ball 4 disposed thereon, and a size of each of the electrically conductive pillars 3 is fixed. Comparing to the conventional technology, which uses solder balls or Cu core balls for bonding, the present disclosure utilizing the electrically conductive pillars 3 with solder balls 4 can effectively maintain a flatness of the adapter board 2 when the adaptor board is bonded with the circuit board 1 (since the size of each of the electrically conductive pillars 3 is fixed), and an amount of solder can also be effectively controlled (in the conventional technology, an amount of solder of the solder ball is too high, and an amount of solder of the Cu core ball is too low). In addition, the diameter D of each of the electrically conductive pillars 3 and the gap H between two adjacent ones of the electrically conductive pillars 3 in the present disclosure are very small, such that the electrically conductive pillars 3 that may be configured on an interface between the adapter board 2 and the circuit board 1 are arranged in a large quantity and densely disposed. As a result, a signal transmission speed between the adapter board 2 and the circuit board 1 can be greatly accelerated.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A probe card structure, comprising:
   a circuit board;
   an adapter board disposed on one side of the circuit board, a plurality of electrically conductive pillars formed on one surface of the adapter board that faces the circuit board, a solder ball disposed on one end of each of the plurality of electrically conductive pillars facing the circuit board;
   a probe head assembly including a plurality of probes, the probe head assembly coupled to the adapter board, and the plurality of probes electrically connected to the adapter board; and
   an interposer board disposed between the adapter board and the circuit board, wherein a plurality of second electrically conductive pillars are formed on one surface of the interposer board facing the circuit board, a second solder ball is disposed on one end of each of the plurality of second electrically conductive pillars facing the circuit board, and the interposer board is soldered to the circuit board through the plurality of second solder balls of the second electrically conductive pillars;
   wherein the adapter board is soldered to the interposer board through the plurality of solder balls of the plurality of electrically conductive pillars, and
   wherein each of the electrically conductive pillars has a same size and each of the second electrically conductive pillars has a same size.

2. The probe card structure according to claim 1, further comprising a fixing frame member detachably fixed on the one side of the circuit board and abutted against a periphery of the probe head assembly, and the fixing frame member being used to fix the adapter board and the probe head assembly on a same side of the circuit board.

3. The probe card structure according to claim 2, further comprising a structure strengthening member, wherein the structure strengthening member and the adapter board are respectively arranged on opposite sides of the circuit board.

4. The probe card structure according to claim 3, further comprising a plurality of locking members, wherein the fixing frame member includes a plurality of first through holes, the circuit board includes a plurality of second through holes corresponding to the plurality of first through holes, and the structural reinforcement member includes a plurality of threaded holes corresponding to the plurality of second through holes; wherein the plurality of locking members respectively pass through the plurality of first through holes and the plurality of second through holes to be inserted in the plurality of threaded holes, so as to fix the fixing frame member.

5. The probe card structure according to claim 1, wherein a material of the plurality of electrically conductive pillars is copper or a copper alloy.

6. The probe card structure according to claim 1, wherein a diameter of the plurality of electrically conductive pillars is less than 200 μm.

7. The probe card structure according to claim 1, wherein one end of each of the plurality of probes is electrically connected to the adapter board, another end of each of the plurality of probes is in contact with a device under test, and the adapter board and the device under test have same material characteristics.

8. The probe card structure according to claim 7, wherein the material characteristics include hardness, ductility, electrical conductivity, or thermal expansion coefficient.

* * * * *